US011620758B2

(12) United States Patent
Ito et al.

(10) Patent No.: US 11,620,758 B2
(45) Date of Patent: Apr. 4, 2023

(54) ELECTRIC CHARACTERISTIC ACQUISITION APPARATUS

(71) Applicant: FUJI CORPORATION, Chiryu (JP)

(72) Inventors: Akira Ito, Toyota (JP); Arisa Kawazoe, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 447 days.

(21) Appl. No.: 16/304,744

(22) PCT Filed: Jun. 14, 2016

(86) PCT No.: PCT/JP2016/067663
§ 371 (c)(1),
(2) Date: Nov. 27, 2018

(87) PCT Pub. No.: WO2017/216870
PCT Pub. Date: Dec. 21, 2017

(65) Prior Publication Data
US 2020/0027221 A1    Jan. 23, 2020

(51) Int. Cl.
*G06T 7/30* (2017.01)
*G01R 27/02* (2006.01)
(Continued)

(52) U.S. Cl.
CPC ............... *G06T 7/30* (2017.01); *G01R 27/02* (2013.01); *H05K 13/0409* (2018.08); *H05K 13/082* (2018.08)

(58) Field of Classification Search
CPC ...... G06T 7/30; G01R 27/02; H05K 13/0409; H05K 13/082
See application file for complete search history.

(56) References Cited

U.S. PATENT DOCUMENTS 7,383,140 B2 *   6/2008   Paz ................. G01R 27/02
                                                    702/65
7,782,043 B1 *   8/2010   Sobolewski ....... G01R 31/2844
                                                    324/76.11
(Continued)

FOREIGN PATENT DOCUMENTS

JP    2008-85745 A    4/2008
JP    2014-25772 A    2/2014
(Continued)

OTHER PUBLICATIONS

International Search Report dated Sep. 13, 2016 in PCT/JP2016/067663 filed on Jun. 14, 2016.

*Primary Examiner* — Tarun Sinha
*Assistant Examiner* — Yossef Korang-Beheshti
(74) *Attorney, Agent, or Firm* — Oblon, McClelland, Maier & Neustadt, L.L.P.

(57) ABSTRACT

In an electrical characteristic acquisition apparatus, a condition under which an electrical characteristic of a target object is acquired can be inputted by an operator, and an electrical characteristic of the target object is acquired under the input condition. In a case where a condition is inputted as a condition under which an electrical characteristic of the target object is acquired, an erroneous determination is made due to the different conditions that the target object is not an electrical component which complies with the nominal value, or, in a case where a difference between a value representing an electrical characteristic of the target object and a nominal value of the target object is larger than a permissible tolerance, an erroneous determination is made that the target object is defective. Here, these erroneous determinations are prevented from being made.

6 Claims, 14 Drawing Sheets

(51) Int. Cl.
*H05K 13/04* (2006.01)
*H05K 13/08* (2006.01)

(56) References Cited

U.S. PATENT DOCUMENTS

| | | | | |
|---|---|---|---|---|
| 2015/0089801 A1* | 4/2015 | Cho | ............... | H05K 13/082 |
| | | | | 29/705 |
| 2016/0150687 A1* | 5/2016 | Shibata | ............... | H05K 13/084 |
| | | | | 700/121 |
| 2017/0173637 A1* | 6/2017 | Makino | ............... | G01N 27/9026 |
| 2018/0203041 A1* | 7/2018 | Sawada | ............... | H05K 13/082 |

FOREIGN PATENT DOCUMENTS

| | | | |
|---|---|---|---|
| JP | 2014025772 A | * | 2/2014 |
| WO | WO 2014/203331 A1 | | 12/2014 |

\* cited by examiner

FIG. 8
(a)
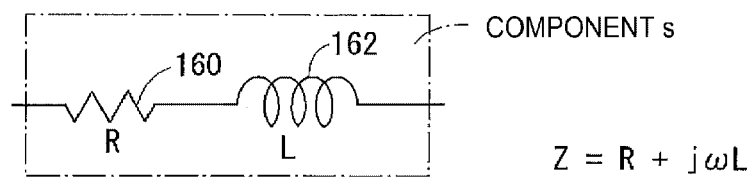
(b)
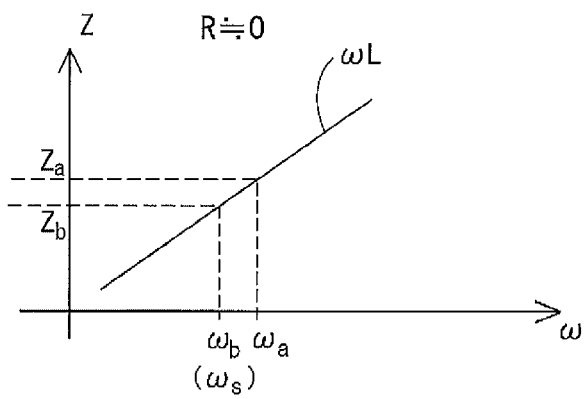
(c)
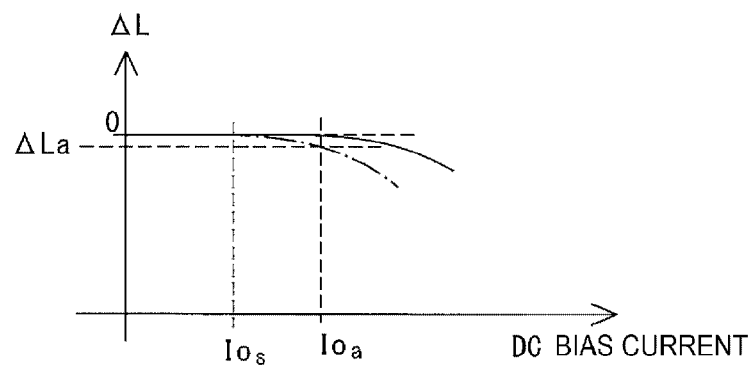

FIG. 9
(a) INITIAL STATE
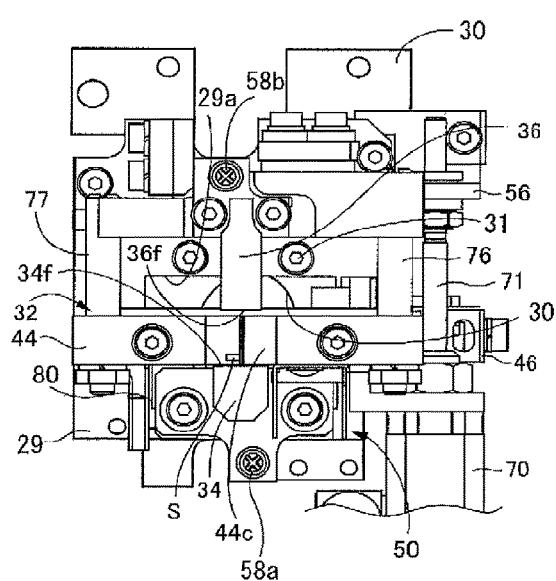
(c) MEASURING STATE
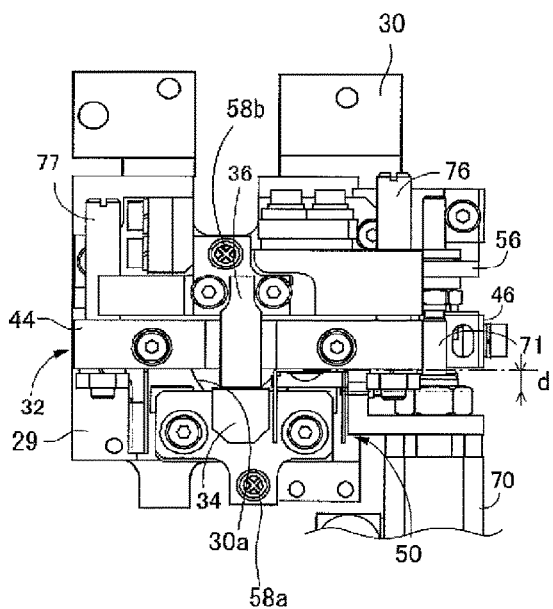
(b) CLAMPING STATE
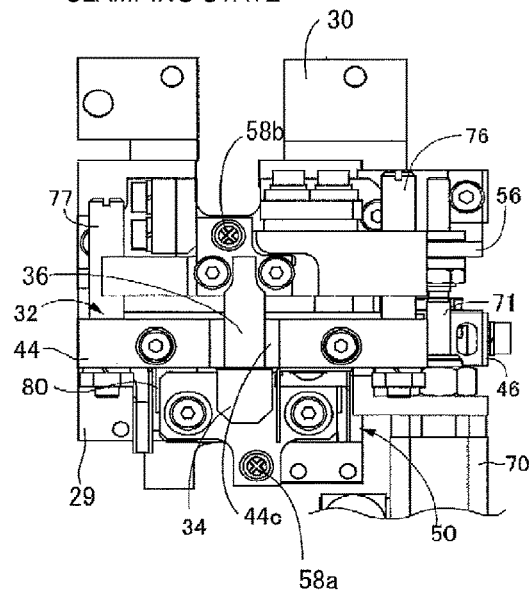
(d) DISLOCATED STATE
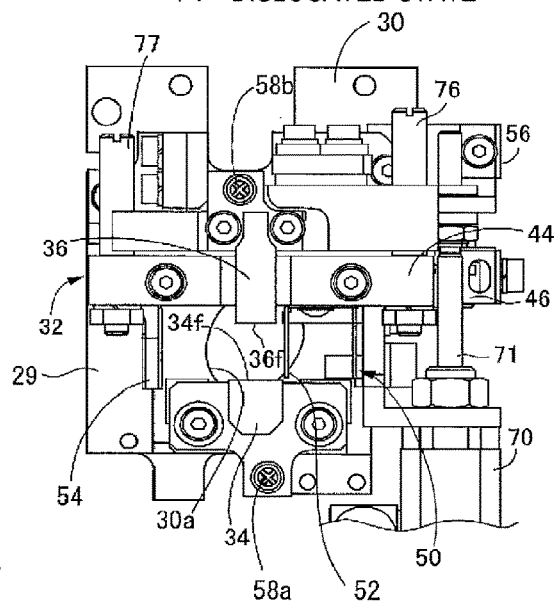

FIG. 10

```
LCR Check Parameter
┌─────────────────────────────────────────────────┐
│ Type                                            │
│ ⦿ Inductor (L)   ○ Capacitor (C)   ○ Resistor (R) │
└─────────────────────────────────────────────────┘

┌─────────────────────────────────────────────────┐
│ Nominal Value                                   │
│     Inductance    [        ***  ]   [ u ▼] H    │
│     Tolerance     [       *.**  ] %             │
└─────────────────────────────────────────────────┘

┌─────────────────────────────────────────────────┐
│ Measurement                                     │
│     frequency    [              ]  [ k ▼] Hz    │
│                                    (40Hz-200kHz)│
│     current      [              ] mA            │
└─────────────────────────────────────────────────┘

[   OK   ]          [  CANCEL  ]
```
— 116

FIG. 11

```
LCR Check Parameter
┌─────────────────────────────────────────────┐
│ Type                                        │
│ ⊙Inductor (L)   ○ Capacitor (C)   ○ Resistor (R) │
└─────────────────────────────────────────────┘

┌─────────────────────────────────────────────┐
│ Nominal Value                               │
│     Inductance    [        ***]   [u ▼]H    │
│     Tolerance     [      *.**] %            │
└─────────────────────────────────────────────┘

┌─────────────────────────────────────────────┐
│ Measurement                                 │
│    frequency      [        ***]   [k ▼]Hz   │
│                                   (40Hz-200kHz) │
│    current        [      **.**] mA          │
└─────────────────────────────────────────────┘

[    OK    ]         [  CANCEL  ]
```
— 116

ELECTRIC CHARACTERISTIC ACQUISITION APPARATUS

TECHNICAL FIELD

The present application relates to an electrical characteristic acquisition apparatus for acquiring an electrical characteristic of a target object.

BACKGROUND ART

Patent Literature 1 describes an LCR measurement device as an electrical characteristic acquisition apparatus. In this LCR measurement device, an impedance is acquired as an electrical characteristic of a target object, but also a correction value G is acquired for reducing a linearity error of an AD converter which is a constituent element of the LCR measurement device. An impedance is acquired for a reference target object (a target object whose impedance is known) by measuring a voltage supplied and a current flowing to the reference target object by changing a frequency with the voltage supplied being kept constant, and then, a correction value G is acquired by use of the acquired impedance, the known impedance, and the like.

CITATION LIST

Patent Literature

Patent Literature 1: Japanese Patent Application Laid-Open No. 2008-85745

BRIEF SUMMARY

Technical Problem

A problem to be solved in this disclosure is to improve an electrical characteristic acquisition apparatus configured to acquire an electrical characteristic of a target object and, more particularly, and the usability of such an electrical characteristic acquisition apparatus.

Solution to Problem, Operation and Effects

In an electrical characteristic acquisition apparatus according to the disclosure, although an electrical characteristic of a target object is acquired by supplying an alternating current signal to the target object, an operator can input a condition under which an electrical characteristic of the target object is acquired.

In the electrical characteristic acquisition apparatus, an electrical characteristic of a target object is acquired under the condition inputted by the operator, and the operator can acquire an electrical characteristic of the target object under the condition inputted by him or her.

The target object is such that the impedance, which is one of examples of electrical characteristics, changes as the frequency of the supplied alternating current signal changes, and for example, an electric component including one of a coil and a capacitor corresponds to the target object. In addition, for example, the frequency or magnitude of the alternating current signal, being supplied to the target object, may correspond to the conditions under which the electrical characteristic of the target object is acquired.

The specification of the target object (which may be referred to as a specification) usually describes the nominal value of the electrical characteristic (which may be referred to as a nominal value), the condition under which the nominal value is acquired, for example, the frequency and magnitude of the alternating current signal supplied to the target object (hereinafter referred to as a specified frequency and a specified signal value). When the target object includes a coil with a core, the electrical characteristics may change when the magnitude of the alternating current signal supplied to the target object changes. For example, when the bias current which represents the magnitude of the alternating current signal (referred to also as a DC bias current) increases, the inductance, representing an example of the electrical characteristics, decreases due to magnetic saturation.

On the other hand, in the electrical characteristic acquisition apparatus, the frequency and magnitude of the alternating current signal supplied to the target object may be predetermined from time to time; however, when the predetermined frequency is different from the specified frequency, the value of the acquired electrical characteristic may be different from the nominal value. When the predetermined bias current has a magnitude which is larger than the specified bias current, which is the specified signal value, and in which the inductance is reduced due to magnetic saturation, the inductance cannot be acquired accurately.

To the contrary, for example, when the operator inputs specified frequency and specified signal value as a frequency and magnitude of an alternating current being supplied to a target object, an electrical characteristic is acquired in such a state that the alternating current signal of the specified frequency and the specified signal value is supplied to the target object. As a result, as for a difference between the acquired electrical characteristic of the target object (hereinafter, referred to as a measured value occasionally) and the nominal value, which is caused by different conditions for acquiring the electrical characteristic, it is possible to prevent an absolute value of the difference from becoming larger. It is possible to accurately determine whether the target object is an electrical component corresponding to the nominal value, or whether the target object is defective (for example, whether the absolute value of the difference between the measured value and the nominal value is larger than a tolerance specified for the target object). In addition, the operator can input a desired condition to the conditions under which the electrical characteristic of the target object is acquired, which allows the operator to acquire an electrical characteristic of the target object under the desired condition. Thus, as described above, the usability of the electrical characteristic acquisition apparatus can be improved by allowing the operator to input the conditions under which the electrical characteristic of the target object are acquired.

BRIEF DESCRIPTION OF DRAWINGS

FIG. 8(a) is a diagram showing the structure of an object from which electrical characteristics are acquired in the LCR measurement device. FIG. 8(b) is a diagram showing a change in impedance of the target object with change in frequency. FIG. 8(c) is a diagram showing a change in inductance of the target object with change in DC bias current.

FIG. 9 is a diagram showing an operation of the LCR measurement device. FIG. 9(a) is a diagram showing an initial state, FIG. 9(b) a clamping state, FIG. 9(c) a measuring state, and FIG. 9(d) a dislocated state.

FIG. 10 is a diagram showing a display of the LCR measurement device (when an input is requested).

FIG. 11 is a diagram showing the display of the LCR measurement device (when an input is being executed).

DESCRIPTION OF EMBODIMENT

Hereinafter, a mounting machine including an electrical characteristic acquisition apparatus according to an embodiment of the present disclosure will be described in detail with reference to drawings.

Figure 1:
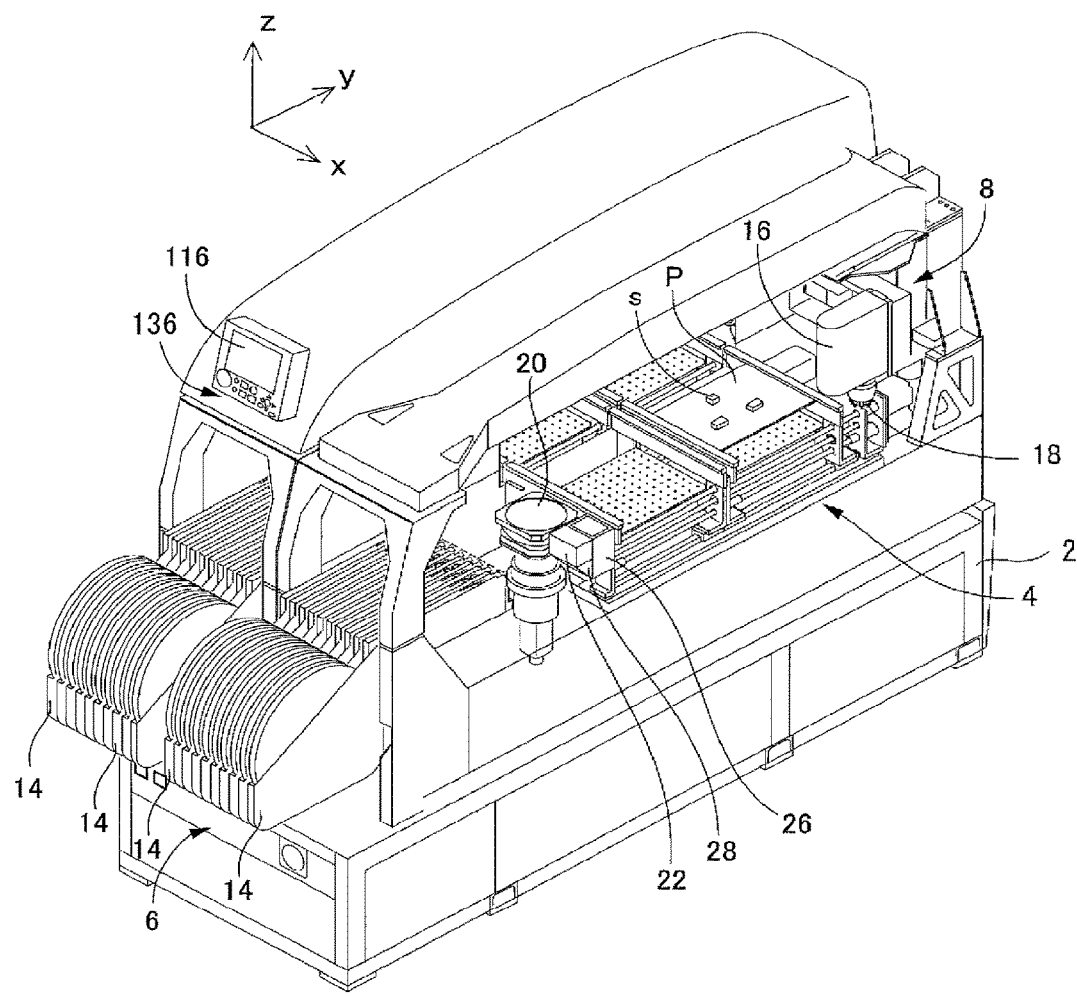
FIG. 1 is a perspective view of a mounting machine including an electrical characteristic acquisition apparatus according to an embodiment of the disclosure.

A mounting machine shown in FIG. 1 mounts a component on a circuit board, and includes machine main body 2, circuit board conveyance and holding device 4, component supply device 6, head moving device 8, and the like.

Circuit board conveyance and holding device 4 conveys and holds circuit board P (hereinafter, referred to briefly as board P) in a horizontal posture, and in FIG. 1, a conveying direction of the board P is referred to a an x direction, a width direction of the board P is referred to as a y direction, and a thickness direction of the board P is referred to as a z direction. The y direction and the z direction are a front-and-rear direction and an up-and down direction of the mounting machine, respectively. The x direction, the y direction and the z direction intersect one another at right angles. Component supply device 6 supplies electronic component (hereinafter, referred to briefly as a component) s to be mounted on board P, and includes multiple tape feeders 14 and the like. Head moving device 8 holds mounting head 16 and moves it in the x, y, and z directions, and mounting head 16 has suction nozzle 18 configured to pick up by suction and hold component s.

Reference numeral 20 denotes a camera. Camera 20 captures an image of a component s held by suction nozzle 18, and it is determined based on the image captured by camera 20 whether component s is a component to be mounted on circuit board P. Reference numeral 22 denotes an LCR measurement device as an electrical characteristic acquisition apparatus. LCR measurement device 22 measures an electrical characteristic of component s as a target object, and L (inductance), C (capacitance), R (resistance), Z (impedance), and the like constitute electrical characteristics of component s. In LCR measurement device 22, it is general practice that for example, impedance Z of component s is measured, and then, inductance L, capacitance C, resistance R, and the like are acquired based on measured impedance Z.

Figure 2:
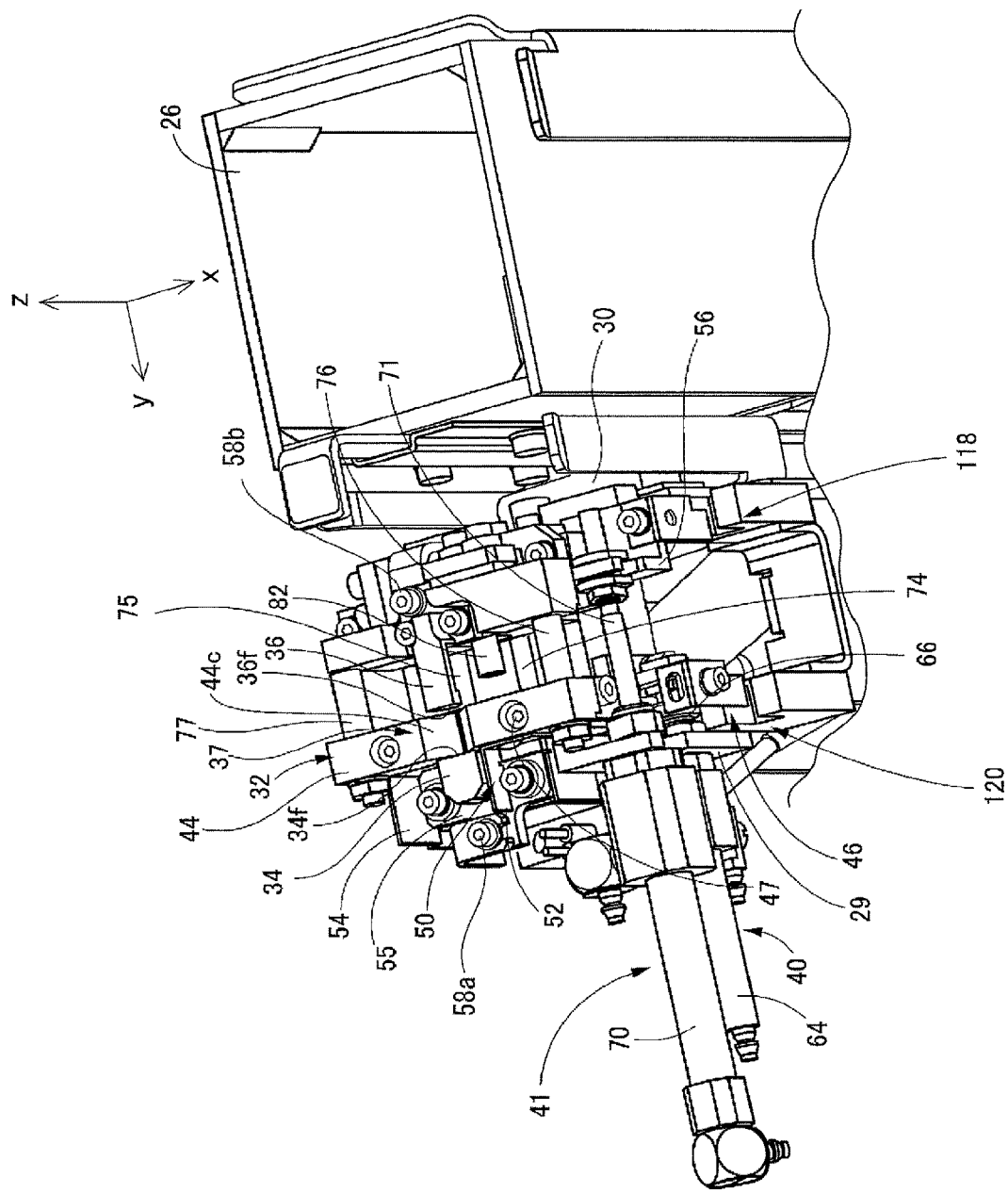
FIG. 2 is a perspective view of an LCR measurement device as the electrical characteristic acquisition apparatus.

LCR measurement device 22 is provided on a main body of circuit board conveyance and holding device 4 via accommodation box 26. Accommodation box 26 and LCR measurement device 22 are connected together by component passage 28, and component s whose electrical characteristic is measured is accommodated in accommodation box 26 by way of component passage 28. LCR measurement device 22 is provided in accommodation box 26 so as to be adjustable in height. As shown in FIG. 2, base section 30, which can be raised and lowered, is brought into engagement with accommodation box 26. Main body 29 is fixed to base section 30 by fastening section 31 (refer to FIGS. 3, 4) which includes a bolt and a nut, whereby base section 30 and main body 29 are held to each other so as to be raised and lowered together. Main body 29 and base section 30 include openings 29a and 30a, respectively, which can communicate with component passage 28 (refer to FIGS. 3 and 4).

Figure 3:
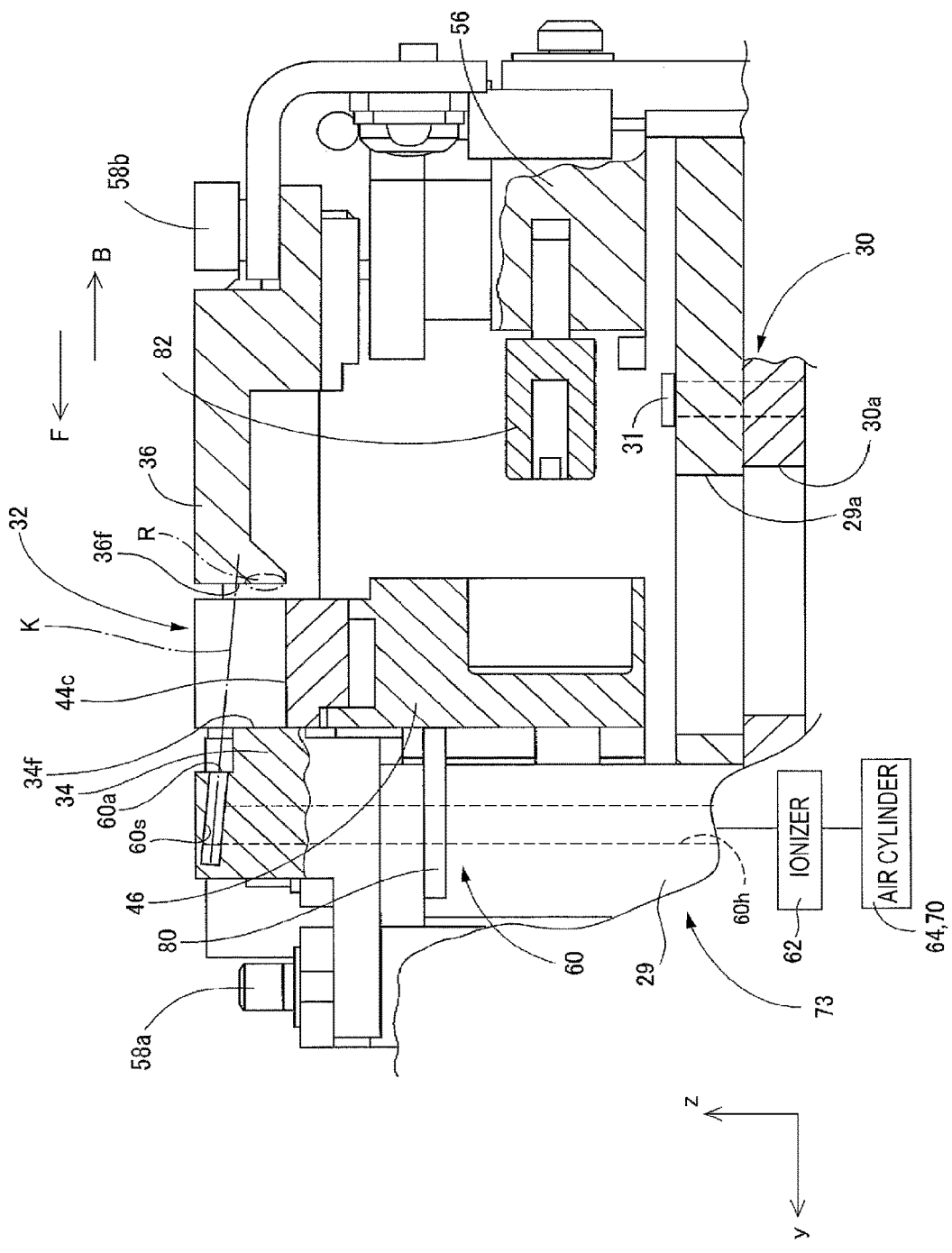
FIG. 3 is a partial sectional view of the LCR measurement device.
Figure 4:
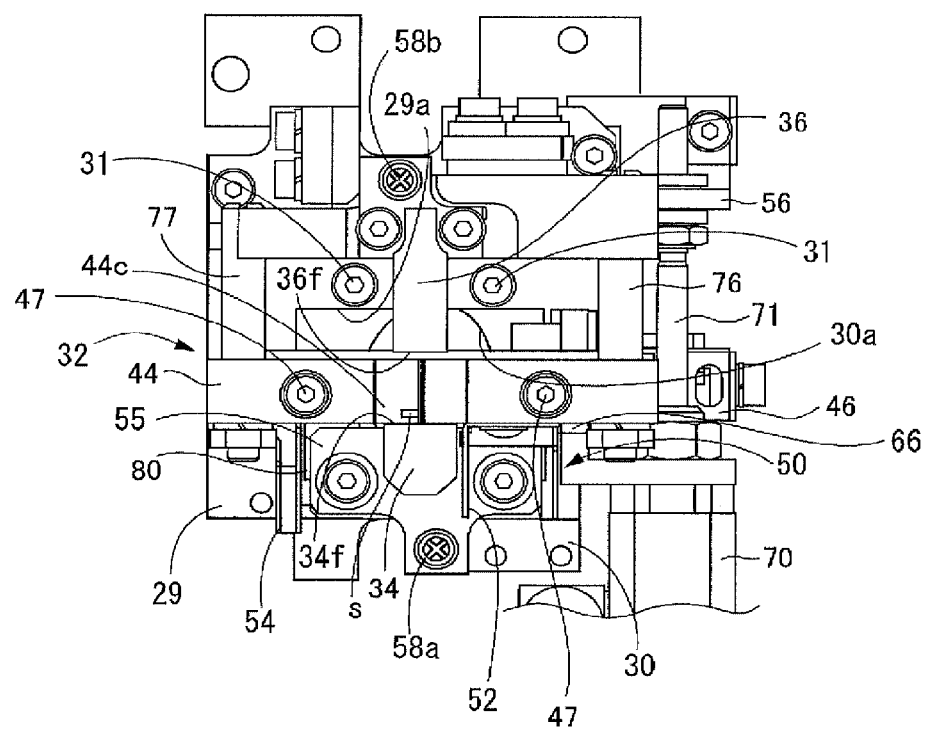
FIG. 4 is a partial plan view of the LCR measurement device.

LCR measurement device 22 includes, as shown in FIGS. 2-4, (i) main body 29 and base section 30, (ii) holding table 32 configured to hold component s, (iii) a pair of measurement parts 37 made up of stationary part 34 and movable part 36, (iv) holding table moving device 40 configured to move holding table 32, (v) movable part moving device 41 configured to move movable part 36 towards and away from stationary part 34, and (vi) LCR acquisition section 42 (see FIG. 7) configured to acquire an electrical characteristic of a component s. In this embodiment, component s has an electrode at each end and can be clamped by the pair of measurement parts 37. A component called a square or rectangular chip constitutes component s of this embodiment. The pair of measurement parts 37 has conductivity, and an alternating current signal is supplied to component s via the measurement parts 37.

Holding table 32 includes component placement section 44 and placement section holding body 46 configured to hold component placement section 44. V-groove 44c is formed on an upper surface of component placement section 44, and component s is rested in V-groove 44c.

Component placement section 44 can be made of a material that is electrically conductive, wear resistant, and hardly oxidized. Component placement section 44 is electrically connected to base section 30 via multiple conductive members, whereby component placement section 44 is grounded as a result of base section 30 is grounded. In this embodiment, component placement section 44 is brought into abutment with placement section holding body 46 and is fixed by fastening section 47. Placement section holding body 46 is brought into abutment with main body 29 via stopper 80 (refer to FIG. 3), and main body 29 is fixed to base section 30 by fastening section 31. Then, placement section holding body 46, stopper 80, main body 29, base section 30, fastening sections 31, 47, and the like have conductivity. Consequently, component placement section 44 is grounded.

Stationary part 34 and movable part 36 have facing surfaces 34f, 36f, respectively, which face each other, and stationary part 34 is fixed to main body 29 via stationary part holding body 55. Movable part 36 is held to movable part holding body 56 so as to move together and is caused to move towards and away from stationary part 34. In this embodiment, facing surface 36f has a triangular section and is allowed to move along V-groove 44c.

Holding table 32 and movable part 36 can move relatively to each other, and holding table 32 can move forwards and backwards of facing surface 36f with a bottom portion of V-groove 44 positioned below movable part 36.

Cover section 50 is attached to holding table 32. Cover section 50 includes cover members 52, 54 which are provided on a side of holding table 32 with facing to stationary part 34, and cover members 52, 54 are disposed apart from each other in the x direction. Cover members 52, 54 extend in the y direction and the z direction, that is, in directions in which the holding table 32 and the movable part 36 move and the up-and-down direction. Cover section 50 has its size enough to cover a space defined between the pair of facing surfaces 34f, 36f from both sides in the x direction at least temporarily during which movable part 36 is caused to move away from the stationary part 34. Cover portion 50 has functions not only to prevent the dispersion of air but also to prevent the scattering of components s caused to fall by injected air.

In a member on the stationary part side (for example, an upper portion of stationary part 34, a portion of stationary part holding body 55 which lies above stationary part 34 or the main body 29), opening 60a of air passage 60 is formed so as to face facing surface 36f of movable part 36. Air passage 60 includes air injecting passage 60s which extends generally in the y direction as shown in FIG. 3, inner passage 60h formed in the main body 29. and the like. Air injecting passage 60s extends obliquely downwards as it approaches the movable part 36 in such a way that with the movable part 36 positioned away from stationary part 34, an extension k of air injecting passage 60s reaches portion R of the facing surface 36f of the movable part 36 or an interior of portion R. Portion R is a portion where component s on the facing surface 36f of the movable part 36 is clamped highly frequently and hence can be referred to as a clamping portion. Air strikes a portion where the extension k of facing surface 36f intersects obliquely downwards from an upper portion.

Air cylinders 64 and 70 are connected to air passage 60. Ionizer 62 is provided at a portion of air passage 60 which lies downstream of air cylinders 64 and 70. Ionizer 62 generates a corona discharge to ionize air, and ionized air can be supplied to facing surface 36f.

Figure 5:
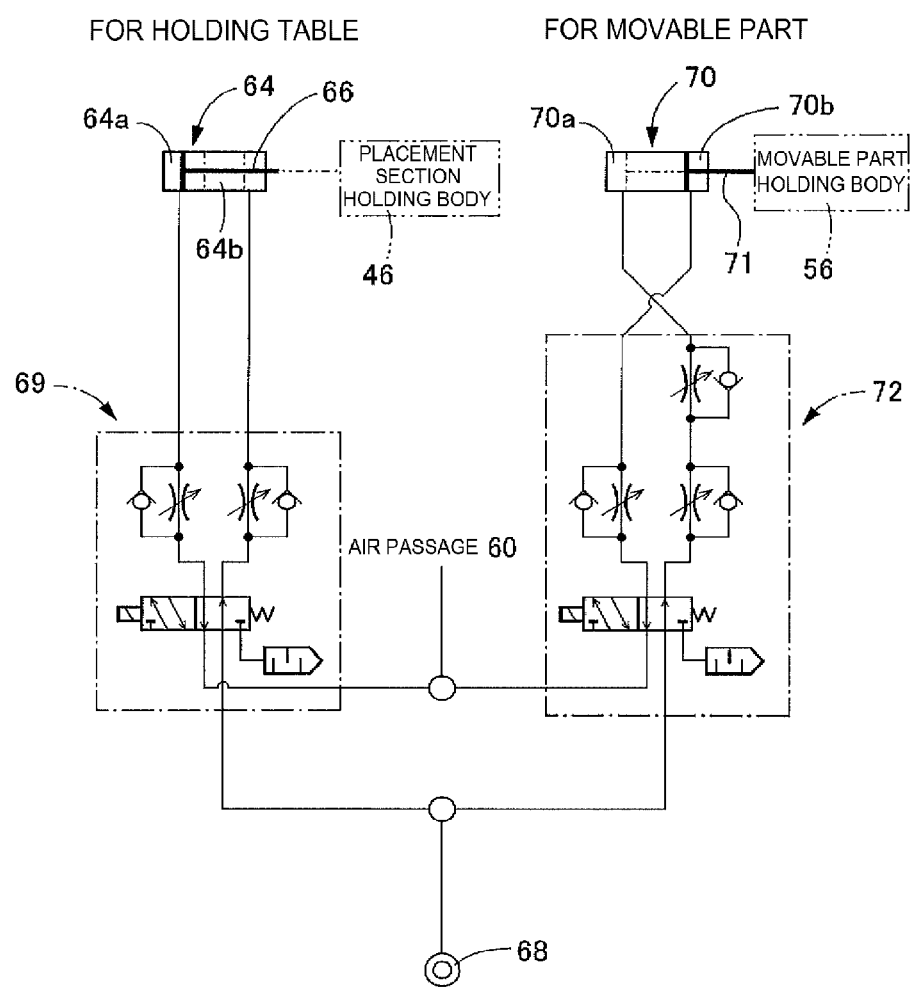
FIG. 5 is an air circuit diagram included in the LCR measurement device.

Holding table moving device 40 includes air cylinder 64 as a drive source fixedly provided in main body 29 or base section 30. Placement section holding body 46 is coupled to piston rod 66 (refer to FIG. 5) of air cylinder 64. Air cylinder 64 includes two air chambers 64a and 64b which are partitioned by a piston in an interior of a cylinder housing, and solenoid valve device 69 is provided between two air chambers 64a, 64b and air source 68, air passage 60, and a filter (atmosphere). Solenoid valve device 69 can include one or more solenoid valves, for example, a direction selector valve and a variable throttle, as shown in FIG. 5. The moving direction of placement section holding body 46 is controlled by the direction selector valve, and the variable throttle controls placement section holding body 46 to move and stop. When solenoid valve device 69 causes air chamber 64b and air chamber 64a to communicate with air source 68 and to communicate with air passage 60, respectively, holding table 32 is caused to move forward (travel in a direction indicated by an arrow F in FIG. 3), while solenoid valve device 69 causes air chamber 64b and air chamber 64a to open to the atmosphere and to communicate with air source 68, respectively, holding table 32 is caused to retract (travel in a direction indicated by an arrow B in FIG. 3).

Movable part moving device 41 includes air cylinder 70 as a drive source fixedly provided in main body 29. Movable part holding body 56, which is configured to move together with the movable part, is connected to piston rod 71 of air cylinder 70. Air source 68, air passage 60, and the filter (atmosphere) are connected to two air chambers 70a, 70b which are partitioned by a piston in an interior of a housing of air cylinder 70 via solenoid valve device 72. Solenoid valve device 72 includes one or more solenoid valves, and can include, for example, a direction selector valve, a variable throttle, and the like. When solenoid valve device 72 causes air chamber 70b and air chamber 70a to communicate with air passage 60 and air source 68, respectively, movable part 36 is caused to retract, while, when solenoid valve device 72 causes air chamber 70a and air chamber 70b to open to the atmosphere and to communicate with air source 68, respectively, movable part 36 is caused to move forward.

In this embodiment, air cylinders 64, 70, air passage 60 (including air injecting passage 60s), opening 60a, cover section 50, ionizer 62, and the like make up air supply device 73.

The structures of solenoid valve devices 69 and 72 are not limited to those of this embodiment. For example, the solenoid valve devices can include one three-way valve or multiple on-off valves. Also, it is not essential to provide ionizer 62.

A pair of guide rods 74, 75 extending in the y direction is provided between movable part holding body 56 and main body 29, and a pair of guide rods 76, 77 extending in the y direction is provided between holding table 32 and movable part holding body 56. End portions of guide rods 74, 75 are connected to movable part holding body 56, and the other end portions are brought into engagement with main body 29 slidably. End portions of guide rods 76, 77 are connected to placement section holding body 46 and are brought into engagement with movable part holding body 56 slidably. Guide rods 74, 75, 76, 77 not only enable holding table 32 and movable part 36 to move relatively in the y direction with respect to main body 29 but also enable holding table 32 and movable part 36 to move relative to each other in the y direction.

As shown in FIG. 3, stopper 82 is provided on a stationary part side of movable part holding body 56, and stopper 80 is provided on main body 29. Stopper 82 places an approach limit between movable part holding body 56 and holding table 32 (placement section holding body 46), and stopper 80 places an approach limit between stationary part 34 (main body 29) and holding table 32.

Figure 6:
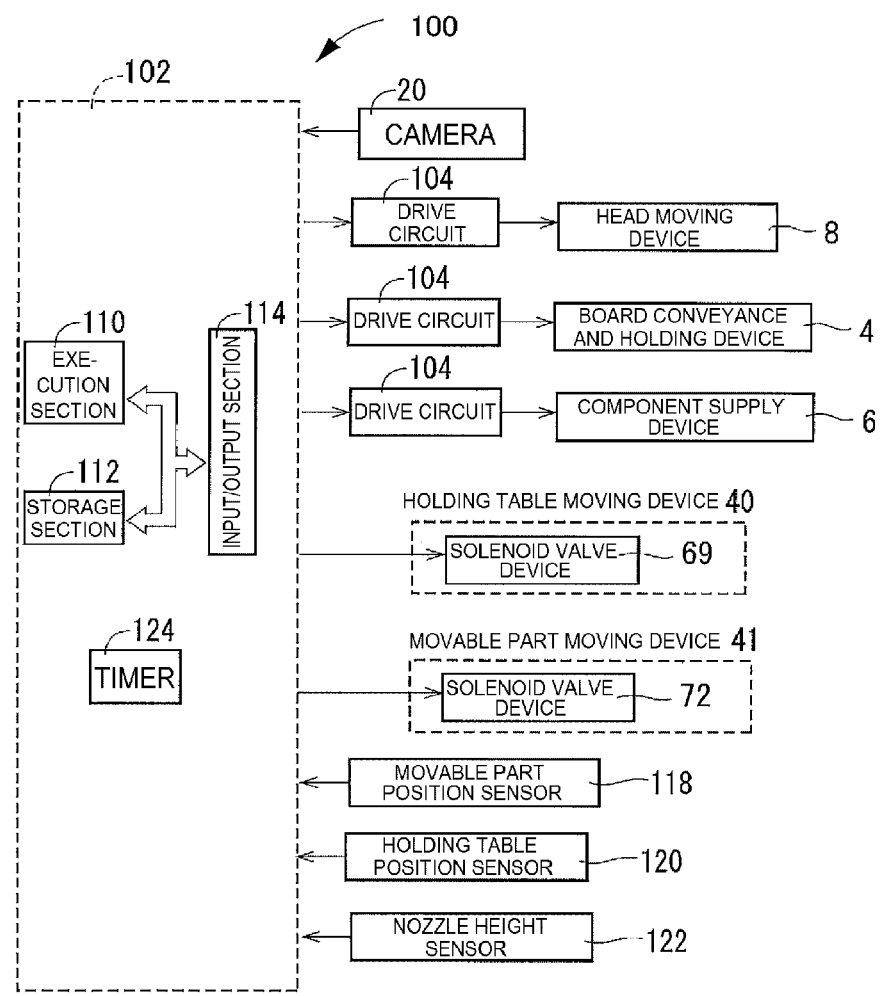
FIG. 6 is a diagram conceptually showing a control device of the mounting machine.

The mounting machine includes control device 100. As shown in FIG. 6, control device 100 includes controller 102 made up mainly of a computer, and multiple drive circuits 104. Controller 102 includes execution section 110, storage section 112, input/output section 114, and the like, and board conveyance and holding device 4, component supply device 6, and head moving device 8 are connected to input/output section 114 via drive circuits 104, and solenoid valve devices 69, 72 of holding table moving device 40 and movable part moving device 41, which are constituent elements of LCR measurement device 22, and the like are connected to input/output section 114. In addition, movable part position sensor 118, holding table position sensor 120, nozzle height sensor 122, and the like are also connected to the input/output section 114. Storage section 112 stores multiple programs such as an LCR acquisition program and tables. Time is measured by timer 124 provided in controller 102. Movable part position sensor 118 and holding table position sensor 120 detect positions of movable part 36 and holding table 32, respectively, and nozzle height sensor 112 detects a height of nozzle 18.

In this embodiment, while the whole of the mounting machine is described as being controlled by control device 100, board conveyance and holding device 4, component supply device 6, head moving device 8, LCR measurement device 22, and the like can also be controlled individually by their corresponding control devices.

Figure 7:
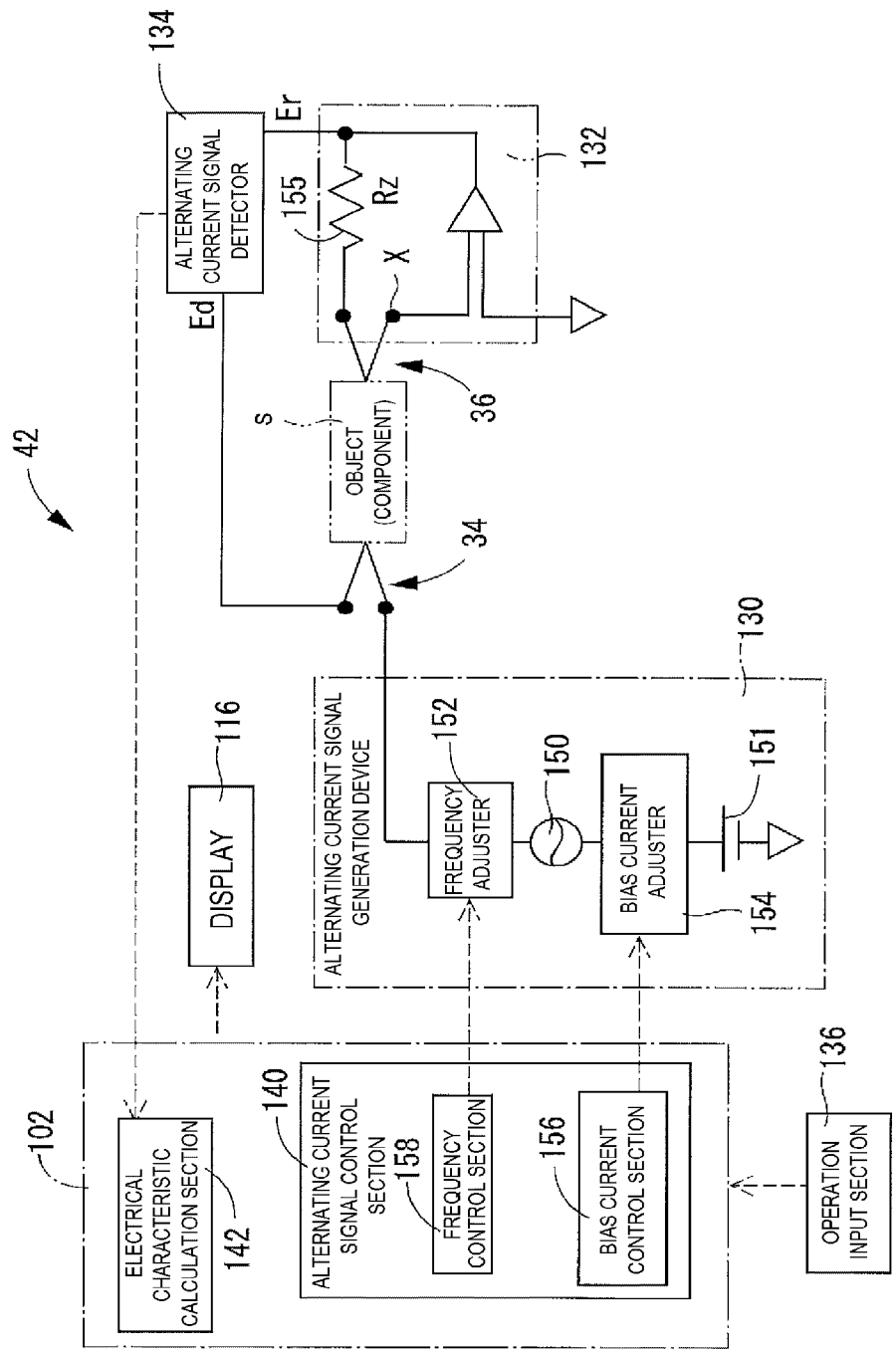
FIG. 7 is a diagram conceptually showing a main part of the LCR measurement device.

As shown in FIG. 7, LCR acquisition section 42 includes the pair of measurement parts 37 including stationary part 34 and movable part 36, alternating current signal generation device 130, automatic balanced bridge section 132, alternating current signal detector 134, operation input section 136, display 116, alternating current signal control section 140, which is part of controller 102, electrical characteristic calculation section 142, and the like and acquires L, C, R, Z, and the like of component s by making use of an automatic balanced bridge method. Alternating current signal generation device 130, automatic balanced bridge section 132, and alternating current signal detector 134 are connected to terminals 58a,b.

Alternating current signal generation device 130 generates an alternating current signal to be supplied to component s and includes alternating current power supply 150, DC power supply 151, frequency adjuster 152, bias current adjuster 154, and the like.

Frequency adjuster 152 can change the frequency of an alternating current signal (in this embodiment, an alternating current) of alternating current power supply 150. The frequency adjuster can include, for example, a frequency feedback circuit to thereby make use of a Phase Locked Loop (PLL) technique. In frequency adjuster 152, a ratio of a frequency divider and a voltage-controlled oscillator are adjusted to adjust the frequency of an alternating current to be output (supplied to a component s).

Bias current adjuster 154 can change a bias current of an alternating current and can include, for example, a variable resistor. In the variable resistor, a resistance value of a resistor provided in series with direct current power supply 151 is adjusted to thereby adjust a bias current value of an alternating current to be outputted (supplied to component s).

Frequency adjuster 152 is not limited to the frequency adjuster which makes use of the PLL technique and hence can be a frequency adjuster which makes use of a Direct Digital Synthesizer (DDC) technique.

Automatic balanced bridge section 132 sets a potential of portion X at 0 (a current flowing to portion X is 0) so that a current flowing to range resistor 155 is equal to a current flowing to component s and includes a detector configured to detect a potential of portion X, an oscillator, and the like. In automatic-balanced bridge section 132, a phase and amplitude of the oscillator are controlled so that the potential of portion X becomes 0.

Alternating current signal detector 134 detects voltage Ed supplied to component s and voltage Er supplied to range resistor 155, and detected voltages Ed and Er are supplied to electrical characteristic calculation section 142 via an A/D converter, not shown. Alternating current signal detector 134 can include a multiplexer, and voltages Ed and Er are selectively detected.

Electrical characteristic calculation section 142 calculates impedance Z of component s based on voltages Ed and Er supplied from alternating current signal detector 134 and magnitude Rz of range resistor 155 (hereinafter, the magnitude of the resistor is referred to as a resistance value) set in advance.

Since the potential at X is 0 and the current flowing through component s is equal to the current flowing through range resistor 155, impedance Z of component s is given by the following equation: $Z = Rz \cdot Ed/Er$ In other words, impedance Z is a value obtained by dividing voltage Ed supplied to component s by current i flowing to component s ($Z=Ed/i$), and current i flowing to component s has value amount obtained by dividing voltage Er supplied to range resistor 155 by resistance value Rz of range resistor 155 ($i=Er/Rz$). Since resistance value Rz is known, current value i flowing to component s is known by detecting voltage Er at alternating current signal detector 134. Therefore, it can be considered that the current flowing to component s is indirectly detected by alternating current signal detector 134. Hereinafter, this may be referred to simply as "the current flowing to component s is detected" in this specification.

Further, in electrical characteristic calculation section 142, inductance L, capacitance C, resistance R. and the like are calculated based on impedance Z and the like.

Component s, which is a target object for detection, is clamped by the pair of measurement parts 37, and in this state, an alternating current is supplied to component s from alternating current signal generation device 130, and voltage Ed supplied to component s and current i flowing to component s are detected.

Operation input section 136 can be operated by the operator and is operated when inputting conditions under which impedance Z of components is acquired, for example, a frequency of an alternating current supplied to component s and a DC bias current (hereinafter, referred to briefly as a bias current). For example, operation input section 136 can be a mouse, the display (touch panel) 116, operation keys, or the like. Operation input section 136 is connected to controller 102 wirelessly or via a signal line. Input information, which is information inputted via the operation input section 136, is supplied to alternating current signal control section 140 of controller 102. In this embodiment, the input information includes input frequency information, which is information representing frequency, and input bias current information, which is information representing bias current.

Alternating current signal control section 140 controls frequency adjuster 152 and bias current adjuster 154 so that a frequency and bias current of an alternating current outputted from alternating current signal generation device 130 approach a frequency and bias current represented by the input frequency information and the input bias current information, respectively, which are supplied via operation input section 136. In this embodiment, in alternating current signal control section 140, a portion or the like configured to control frequency adjuster 152 corresponds to frequency control section 158, and a portion or the like configured to control bias current adjuster 154 corresponds to bias current control section 156.

In this embodiment, component s includes coil (which can also be referred to as an inductor) 160 and resistor 162 which are arranged in series with each other as shown in FIG. 8(a). Impedance Z of component s has a value which is theoretically represented by the following expression where a resistance value of resistor 162, which represents a value of resistor 162, is denoted by R, an inductance of coil 160 with a core is denoted by L, and a frequency of an alternating current supplied to component s is denoted by ω: $Z=\sqrt{\{R^2+(\omega L)^2\}}$ When resistance value R is almost 0 ($R \approx 0$), impedance Z can be expressed as below, and increases as frequency ω increases as shown in FIG. 8(b): $Z \approx \omega L$ On the other hand, inductance L of coil 160 with a core decreases as shown in FIG. 8(c) when an alternating current of a large bias current is supplied to component s due to magnetic saturation; however, some components s have a characteristic indicated by a solid line, and other components s have a characteristic indicated by an alternate long and short dash line.

In a case where the frequency and bias current of the alternating current supplied to component s are determined in advance, the predetermined set frequency and set bias current may be different from a specified frequency and a specified bias current which are specified for component s (the conditions under which the nominal frequency and bias current values are acquired). For example, as shown in FIG. 8(b), in a case where the set frequency is ωa while the specified frequency of the component s is ωb, acquired impedance Za is different from nominal value Zb. Additionally, as shown in FIG. 8(c), the set bias current value is Ioa, but when component s has the characteristic indicated by the alternate long and short dash line, an acquired inductance takes a value which is smaller than nominal value by ΔLa.

In contrast with this, in this embodiment, the operator can input magnitudes for frequency co and bias current Io of an alternating current supplied to component s. For example, the operator can set the frequency to specified frequency ωs (ωb) of component s, and can set the bias current to magnitude Ios in such a range that the inductance is not lowered.

Figure 13:
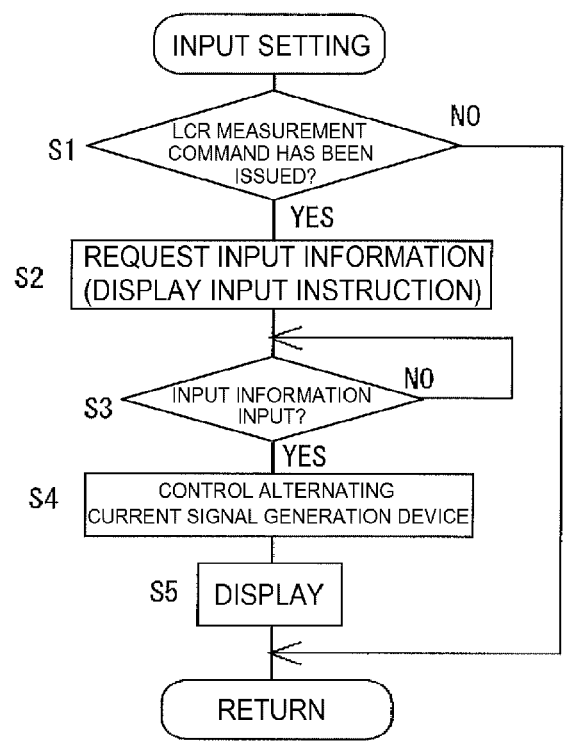
FIG. 13 is a flowchart showing an input setting program stored in the storage section of the control device.
Figure 14:
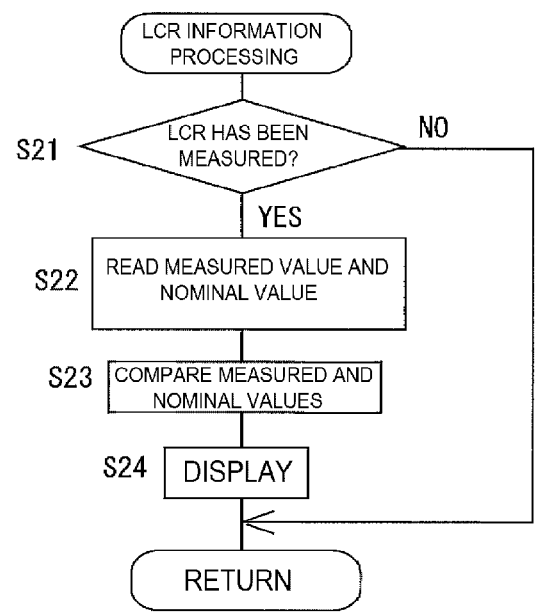
FIG. 14 is a flowchart showing an LCR information processing program stored in the storage section of the control device.

Hereinafter, the operation of LCR measurement device 22 will be described in accordance with an LCR measurement program represented by a flowcharts in FIGS. 9 and 12, an input setting program represented by a flowcharts in FIG. 13, and an LCR information processing program represented by a flowchart in FIG. 14.

When a setup change is performed such as setting new tape feeder 14 or exchanging tape feeders 14, an electrical characteristic of an electric component which is component s held on such tape feeder 14 is measured.

In Step 1 (hereinafter, referred to briefly as S1, and this will be true with other steps) in the flowchart in FIG. 13, it is determined whether an LCR measurement command is issued. An LCR measurement command is issued when a setup change is performed as described above.

Input information is requested in S2, and the input setting is suspended to wait until input information is provided in S3. In other words, as shown in FIG. 10, a display screen appears on the display 116 in which a frequency (frequency) box and a current (bias current) box show no values or are left blank, and the operator is requested to input a frequency and a bias current. When the operator inputs frequency ωs bias current Ios by operating the operation input section 136 (an input step) and input information representing frequency ωs and bias current Ios, that is, input frequency information and input bias current information are supplied to controller 102, a determination to be made in S3 becomes YES, and in S4, frequency adjuster 152 and bias current adjuster 154 are controlled, whereby a frequency and bias current of an alternating current supplied to component s are set at frequency ωs and bias current Ios, respectively (an alternating current signal control step). In S5, as shown in FIG. 11, frequency ωs and bias current Ios which are inputted by the operator are displayed on the display 116.

In this case, the LCR measurement device 22 is in an initial state shown in FIG. 9(a). Movable part 36 is in a retracted end position, and holding table 32 is in an advanced end position, that is, in a position where resting table 32 is in abutment with stopper 80. In this state, holding table 32 is grounded by internal conduction or the like. Movable part 36 does not exist above V-groove 44c of holding table 32, and component s can be rested in V-groove 44c.

Figure 12:
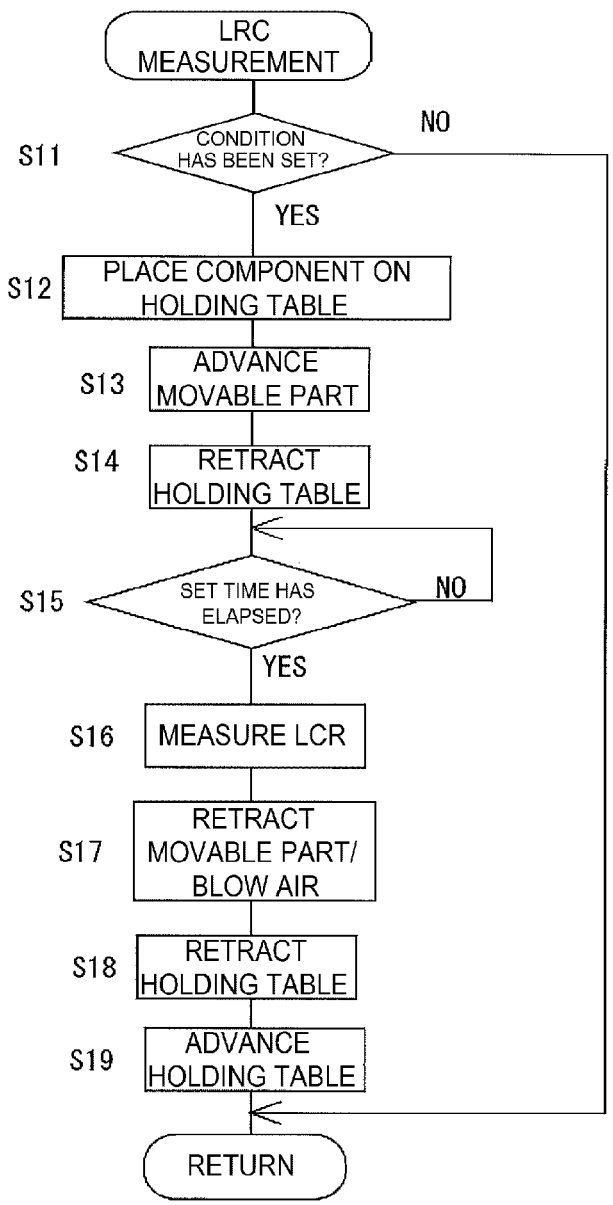
FIG. 12 is a flowchart showing an LCR measurement program stored in a storage section of the control device.

Then, in the flowchart in FIG. 12, when the conditions under which an electrical characteristic of component s is acquired, that is, a frequency and bias current of an alternating current supplied to component s are set at frequency ωs and bias current Ios, which are inputted by the operator, a determination made in S11 becomes YES, component s is rested on V-groove 44c by suction nozzle 18 in S12, and movable part 36 is advanced by an operation of air cylinder 70 which is so controlled by solenoid valve device 72 in S13. Movable part 36 is caused to travel based on the state of movable part position sensor 118, the time measured by timer 124, and the like. Movable part 36 moves forward along V-groove 44c of component placement section 44, and component s is clamped by facing surface 36f of movable part 36 and facing surface 34f of stationary part 34 as shown in FIG. 9(b). This state is referred to as a clamping state.

Next, in S14, as shown in FIG. 9(c), holding table 32 is moved or retracted backward by stroke d until it comes into abutment with stopper 82 by an operation of cylinder 64 which is so controlled by solenoid valve device 69, and is then held in that position. In this embodiment, stroke d has an extent equal to or larger than set value Lx (d≥Lx), and component placement section 44 having conductivity is separated set value Lx or more from component s. This can make it possible to reduce a measurement error of an electrical characteristic caused by the member having conductivity being positioned near component s. As described above, set value Lx is the distance at which component placement section 44 hardly influences the measurement of an electrical characteristic of component s and is the value obtained in advance by an experiment or the like. This state is referred to as a measuring state. Holding table 32 is moved based on the state of holding table position sensor 120, the measured value of timer 124 and the like.

Then, in S15, a static electricity elimination time, which is a set time, is contemplated to elapse since component s is released by suction nozzle 18 to be rested on V-groove 44c. The static electricity elimination time is a time required to remove an estimated amount of static electricity held by component s and can be obtained in advance through an experiment or the like or can be theoretically obtained based on the size, electrical characteristics or the like of component s.

When it is assumed that the static electricity held by component s is removed after the static electricity elimination time has elapsed, an electrical characteristic of component s is measured in S16. The alternating current of frequency ωs and bias current Ios which are inputted by the operator is supplied to component s, and voltage Ed supplied to component s and voltage Er supplied to range resistor 155 are detected (in other words, current i flowing to component s is detected indirectly) by alternating current signal detector 134, and are then supplied to electrical characteristic calculation section 142. Electrical characteristics such as impedance Z and inductance L are acquired through calculation at electrical characteristic calculation section 142 (Acquisition step).

After the electrical characteristics have been measured, in S17, S18, as shown in FIG. 9(d), movable part 36 is retracted, and holding table 32 is retracted by air cylinder 64 which is controlled to so operate by solenoid valve device 69. With holding table 32 retracted to a position where holding table 32 is brought into abutment with stopper 82, holding table 32 is located behind facing surface 36f of movable part 36 and is not situated below a space defined between the pair of facing surface 34f, 36f. This state is referred to as a dislocated state.

Next, in S19, holding table 32 is advanced to strike stopper 80. Holding table 32 is positioned between the pair of facing surfaces 34f and 36f (V-groove 44 is positioned below between facing surfaces 34f and 36f), and a space is defined above V-groove 44c. This enables component s to be rested in V-groove 44c. This state is an initial state.

In this manner, facing surface 36f of movable part 36 is moved away from facing surface 34f of stationary part 34, and this releases component s held between the facing surfaces. Also, holding table 32 is moved backward of facing surface 36f of movable part 36, whereby holding table 32 does not exist anymore below the space defined between the pair of facing surfaces 34f, 36f, whereby the space defined between the pair of facing surfaces 34f, 36f is allowed to communicate with openings 29a, 30a and component passage 28. As a result, component s falls from the pair of facing surfaces 34f and 36f, and is then accommodated in accommodation box 26 by way of openings 29a and 30a and the component passage 28. Component s accommodated in accommodation box 26 is used or discarded.

Further, in S17, as movable part 36 is retracted, air flowing out of air chamber 70a is supplied obliquely downwards to facing surface 36f of movable part 36 from opening 60a above and continues to flow downwards. Due to this, even though component s does not fall from facing surface 36f and continues adhering to portion R, component s can be dropped satisfactorily. In addition, since the space to which the air is supplied, in other words, the space between the pair of facing surfaces 34f and 36f is covered from the x direction by cover section 50, the air flows in a vortex fashion in an interior of cover section 50, and even though component s adheres to facing surface 34f of stationary part 34, component s can be dropped from facing surface 34f.

Thus, as described above, in this embodiment, a holding table movement control device is configured by storage and execution sections of solenoid valve device 69, holding table position sensor 120 and controller 102 which store and execute steps S14, 18, 19.

On the other hand, when the electrical characteristic of component s is acquired, a determination made in S21 in the flowchart in FIG. 14 becomes YES, and in S22, acquired inductance (hereinafter, referred to simply as a measured value from time to time) Ls and nominal value Ln are read in. The nominal value is a value determined based on JOB information and is inputted in advance by the operator as shown in FIGS. 10 and 11. Then, in S23, measured value Ls and nominal value Ln are compared, and in S24, the comparison result is displayed on display 116.

For example, the result of the comparison displayed can be such that mounted tape feeder 14 is determined not to comply with the JOB information (an erroneous mounting) when an absolute value of a difference between measured value Ls and nominal value Ln is a threshold value or larger or that component s or the target object is determined to be defective when the absolute value of the difference between measured value Ls and nominal value Ln is larger than a tolerance. The tolerance (tolerance) is also inputted in advance by the operator (refer to FIGS. 10, 11).

For example, when the operator inputs a condition under which a nominal value of component s is acquired is as a condition under which an electrical characteristic of component s is acquired, it is possible to prevent the absolute value of the difference between measured value Ls and nominal value Ln from becoming large because the condition under which impedance z of component s is acquired is different. As a result, an erroneous determination that tape feeder 14 does not comply with the JOB information can be prevented from being made, or an erroneous determination that component s is defective can be prevented from being made.

On the other hand, when the relationship between frequency ω and impedance Z is known for component s, it is also possible to acquire an impedance, in a case of an alternating current signal of specified frequency ωb being supplied, based on impedance Za that was measured as a result of supplying an alternating current signal of set frequency ωa, and based on the relationship described above. In contrast with this, in this embodiment, the operator can input specified frequency ωb as the frequency of the alternating current supplied to component s. Due to this, the impedance of component s can be acquired more accurately.

In addition, the operator can input desired values for the frequency and bias current of the alternating current when an electrical characteristic of component s is acquired. For example, the operator can input a frequency and a bias current when component s is actually used or upper limit values and lower limit vales of a frequency variable range and a bias current variable range when component s is used, whereby an electrical characteristic of component s can be acquired under the conditions inputted by the operator.

Thus, as described above, the usability of the electrical characteristic acquisition apparatus can be improved by inputting the conditions under which an electrical characteristic is acquired by the operator.

Further, in this embodiment, component placement section 44 is made of a conductive material and is grounded. As a result, the static electricity of component s rested on component placement section 44 can be eliminated well, whereby an impedance of component s can be measured well.

In addition, when ionized air is supplied from the air supply device, facing surfaces 36f, 34f of movable part 36 and stationary part 34 can be electrically neutralized, whereby the accuracy may be increased in measurement of an electrical characteristic of following component s.

Component s may have any structure but including a capacitor or any other whose impedance can vary depending on a frequency. In FIG. 8(a), component s is described as including coil 160 and resistor 162 which are arranged in series with each other; however, in reality, component s may include a parasitic component such as a capacitor.

In the embodiment described above, the frequency and bias current of the alternating current supplied to component s are described as being adjusted; however, an electrical characteristic can similarly be acquired even when the frequency and bias voltage of an alternating voltage as an alternating current signal are adjusted.

Further, LCR acquisition section 42 may utilize a RF I V method, a network analysis method, or the like, as well as the automatic balanced bridge method.

Furthermore, in the disclosure, it is not essential to attach the electrical characteristic acquisition apparatus to the mounting machine, and hence, the electrical characteristic acquisition apparatus can be used separately from the mounting machine, and therefore, in addition to the form described in the embodiment that has been described heretofore, the disclosure can be modified or improved variously based on the knowledge of those skilled in the art.

REFERENCE SIGNS LIST

22: LCR measurement device; 34: stationary part; 36: movable part; 34f, 36f: facing surface; 40: holding table moving device; 41: movable part moving device; 42: LCR acquisition section; 100: control device; 102: controller; 116: display; 130: alternating current signal generation device; 140: alternating current signal control section; 142: electrical characteristic calculation section; 150: alternating current power supply; 151: direct current power supply; 152: frequency adjuster; 154: bias current adjuster; 156: bias current control section; 158: frequency control section.

Hereinafter, characteristics of the present disclosure will be described.

(1) An electrical characteristic acquisition apparatus for acquiring an electrical characteristic of a target object by supplying an alternating current signal to the target object, the electrical characteristic acquisition apparatus including: an operation input section configured to input information which represents at least one of a magnitude and a frequency of the alternating current signal supplied to the target object, the information being input by an operator's operation.

The operation input section can be a touch panel, a mouse or a key. In addition, the operation input section may be provided on a main body of a mounting machine to which the electrical characteristic acquisition apparatus is attached or may be provided separately from the mounting machine.

(2) The electrical characteristic acquisition apparatus according to (1) above, including: an alternating current signal generation device configured to generate the alternating current signal supplied to the target object; and an alternating current signal control section configured to control the alternating current generation device based on the input information inputted via the operation input section to thereby control an alternating current signal supplied to the target object, wherein an electrical characteristic of the target object is acquired by supplying the alternating current signal controlled by the alternating current control section to the target object.

(3) The electrical characteristic acquisition apparatus according to (2) above, wherein the input information includes input frequency information which is information representing a frequency of the alternating current signal, wherein the alternating current signal generation device includes a frequency adjuster configured to change the frequency of the alternating current signal, and wherein the alternating current signal control section includes a frequency control section configured to control the frequency adjuster to cause a frequency of the alternating current signal to approach the frequency represented by the input frequency information.

The alternating current signal generation device includes an alternating current power supply, and the frequency of an alternating current signal outputted from the alternating current power supply is changed by the frequency adjuster. The alternating current signal can be an alternating current or an alternating voltage.

(4) The electrical characteristic acquisition apparatus according to (2) or (3) above, wherein the alternating current signal generation device includes a bias current adjuster configured to change a bias current of an alternating current which is the alternating current signal, wherein the input information includes input bias current information which represents a magnitude of the bias current of the alternating current as the magnitude of the alternating current signal, and wherein the alternating current signal control section includes a bias current control section configured to control the bias current adjuster to cause a magnitude of the bias current of the alternating current to approach the magnitude of the bias current represented by the input bias current information. The alternating current signal generation device includes a direct current power supply and an alternating current power supply, and the magnitude of a direct current outputted from the direct current power supply is adjusted by the bias current adjuster, and an alternating current whose bias current is adjusted by the bias current adjuster is supplied from the alternating current signal generation device to the target object.

The bias current is a median value of an amplitude of an alternating current, and the alternating current is caused to oscillate about the bias current.

(5) The electrical characteristic acquisition apparatus according to any one of (1) to (4) above, including: an alternating current signal detector configured to detect a voltage supplied to the target object and a current flowing to the target object; and an LCR acquisition section configured to acquire an electrical characteristic of the target object based on the voltage and the current which are detected by the alternating current signal detector.

An impedance is obtained by dividing a voltage supplied to a target object by a current flowing to the target object, and an inductance, capacitance, resistance and the like are acquired based on the impedance. The alternating current detector may detect directly or indirectly a current flowing to the target object.

(6) The electrical characteristic acquisition apparatus according to any one of (1) to (5) above, wherein the target object includes a coil, and wherein the electrical characteristic acquisition apparatus acquires an impedance of the target object as an electrical characteristic of the target object.

(7) The electrical characteristic acquisition apparatus according to anyone of (1) to (6) above, including an informing device configured to display the input information inputted via the operation input section.

The informing device can be a display or an audio signal output device configured to generate and output an audio signal representing input information.

(8) The electrical characteristic acquisition apparatus according to any one of (1) to (7) above, the electrical characteristic acquisition apparatus being provided on a mounting machine for picking up a component supplied by a component supply device to mount the component on a circuit board, the electrical characteristic acquisition apparatus including: a holding table configured to hold the component; a holding table moving device including a pair of measurement parts configured to move towards and away from each other and hold the component; a holding table moving device configured to move the holding table; and a holding table movement control device configured to control the holding table moving device to shift a clamping state, where the pair of measurement parts clamps the components held on the holding table, to a measuring state, where the holding table is moved with a set value or more away from the component, to enable an electrical characteristic of the target object to be measured, wherein in the measuring state, the alternating current signal is supplied to the component which is the target object via the pair of measurement parts to acquire an electrical characteristic of the component.

The holding table may move in a direction parallel to a direction in which the pair of measurement parts move towards and away from each other or may move in a direction which intersects the direction in which the pair of measurement parts move towards and away from each other. For example, in a case where the holding table has conductivity, the set value can be a distance at which the holding table hardly influences the measurement of an electrical characteristic of the target object.

(9) An electrical characteristic acquisition method for acquiring an electrical characteristic of a target object by supplying an alternating current signal to the target object, the electrical characteristic acquisition method including: an input step of inputting information on the alternating current signal by an operator;

an alternating current signal control step of controlling an alternating current signal supplied to the target object based on input information which is the information inputted in the input step; and an acquisition step of acquiring an electrical characteristic of the target object by supplying the alternating current signal controlled in the alternating current signal control step to the target object.

The electrical characteristic acquisition method described under (9) here can be executed by the electrical characteristic acquisition apparatus according to any one of (1) to (8) above.

The invention claimed is:

1. An electrical characteristic acquisition apparatus for acquiring an electrical characteristic of a target object by supplying an alternating current signal to the target object, the electrical characteristic acquisition apparatus being provided on a mounting machine for picking up a component supplied by a component supply device to mount the component on a circuit board, the electrical characteristic acquisition apparatus comprising:
   a holding table including a groove configured to receive the component released from a nozzle of the mounting machine, the component being the target object;
   a holding table moving device configured to move the holding table between a clamping state, a measurement state, and a dislocated state;
   a pair of measurement parts configured to move towards and away from each other and hold the component with the holding table in the measuring state where the alternating current signal is supplied to the component via the pair of measurement parts to acquire the electrical characteristic of the component;
   an operation input section configured to input information includes a frequency of the alternating current signal and a bias current supplied to the target object;
   a display configured to display the input information inputted via the operation input section; and
   a controller operatively connected to the holding table moving device, the operation input section and the display, the controller configured to
      display on the display the frequency and the bias current to be supplied to the target object as blank values,
      request, via the display, an operator to input the input the input information to replace the blank values of the frequency and the bias current to be supplied to the target object with the operation input section,
      after the input information is input, set the pair of measurement parts to the frequency and bias current input by the operator,
      control the pair of measurement parts to hold the component with the holding table in the clamping state,
      control the holding table moving device to move the holding table from the clamping state to the measurement state where the holding table is behind clamping surfaces of the pair of measurement parts and an opening is below the component clamped by the pair of measurement parts,
      control the pair of measurement parts to acquire the electrical characteristic of the component, and
      control the pair of measurement parts to release the component into the opening.

2. The electrical characteristic acquisition apparatus according to claim 1, comprising:
   an alternating current signal generation device configured to generate the alternating current signal supplied to the target object,
   wherein the controller includes an alternating current signal control section configured to control the alternating current signal generation device, based on the input information input via the operation input section by the operator, so as to control the alternating current signal supplied to the target object,
   wherein the controller controls the alternating current signal generation device to generate the alternating current at the frequency input by the operator, and
   wherein the electrical characteristic of the target object is acquired by supplying the alternating current signal controlled by the alternating current signal control section to the target object.

3. The electrical characteristic acquisition apparatus according to claim 2,
   wherein the alternating current signal generation device includes a frequency adjuster configured to change the frequency of the alternating current signal, and
   wherein the alternating current signal control section comprises a frequency control section configured to control the frequency adjuster to cause a frequency of the alternating current signal to approach the frequency input by the operator.

4. The electrical characteristic acquisition apparatus according to claim 2,
   wherein the alternating current signal generation device includes a bias current adjuster configured to change the bias current of the alternating current of the alternating current signal,
   wherein the input information includes input bias current information which represents a magnitude of the bias current of the alternating current as the magnitude of the alternating current signal, and
   wherein the alternating current signal control section comprises a bias current control section configured to control the bias current adjuster to cause a magnitude of the bias current of the alternating current to approach the magnitude of the bias current information input by the operator.

5. The electrical characteristic acquisition apparatus according to claim 1,
   wherein the target object comprises a coil, and
   wherein the electrical characteristic acquisition apparatus acquires an impedance of the target object as the electrical characteristic of the target object.

6. The electrical characteristic acquisition apparatus according to claim 1,
   wherein the controller is configured to control the holding table moving device to shift between the clamping state, where the pair of measurement parts clamps the component held on the holding table, and the measuring state, where the holding table is moved with a set value or more away from the component, to enable the electrical characteristic of the target object to be measured, the set value corresponding to a position where a conductivity of the groove does not influence the acquiring the electrical characteristic of the component.

* * * * *